United States Patent [19]

Leach

[11] Patent Number: 4,560,954
[45] Date of Patent: Dec. 24, 1985

[54] LOW POWER OSCILLATOR CIRCUIT

[75] Inventor: Jerald G. Leach, Houston, Tex.

[73] Assignee: Texas Instruments Incorporated, Dallas, Tex.

[21] Appl. No.: 334,487

[22] Filed: Dec. 24, 1981

[51] Int. Cl.$^4$ .............................................. H03B 5/12
[52] U.S. Cl. ................................... 331/108 B; 331/57; 331/DIG. 3; 307/448; 307/481
[58] Field of Search ....................... 331/45, 50, 55, 56, 331/57, 104, 108 A, 108 B, 108 C, 111, 113 R, 143, 144, DIG. 3; 307/445, 448, 480, 481, 482

[56] References Cited

U.S. PATENT DOCUMENTS

| | | | |
|---|---|---|---|
| 3,702,945 | 11/1972 | Faith et al. | 307/481 X |
| 3,854,103 | 12/1974 | Takarada | 331/55 |
| 4,083,020 | 4/1978 | Goldberg | 331/DIG. 3 X |
| 4,236,121 | 11/1980 | Senturia | 331/57 |

FOREIGN PATENT DOCUMENTS 30368  3/1977  Japan .......................... 331/DIG. 3

OTHER PUBLICATIONS

Shepherd, I. E. "Oscillator Starts in a Defined State", Electronic Engineering, Jun. 79, p. 31.
Gordon, R. E. "Stable Wideband Relaxation Oscillator Using Three Inverting Amplifiers", National Bureau of Standards, Technical Note #437, Nov. 67, pp. 21-22.

Primary Examiner—Eugene R. LaRoche
Assistant Examiner—Robert J. Pascal
Attorney, Agent, or Firm—Thomas E. Tyson; Leo N. Heiting; Melvin Sharp

[57] ABSTRACT

A low power oscillator circuit including a latch connected to two loops. Each loop includes dynamic inverters and static inverters connected in cascade. The loops are connected to the latch such that the output of the final stage is an input to the latch. An initialization circuit is included on one loop to initiate oscillation. Storage capacitors are included in the loops to provide an oscillator output voltage that is greater than the oscillator power supply voltage.

2 Claims, 14 Drawing Figures

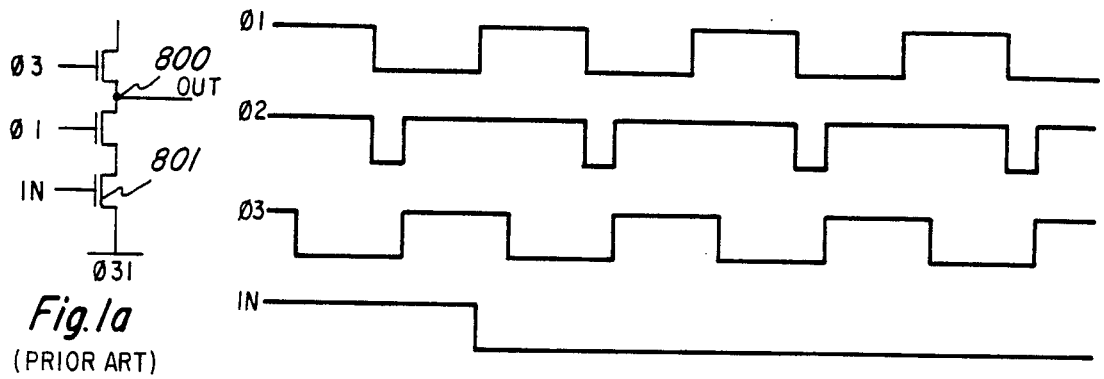
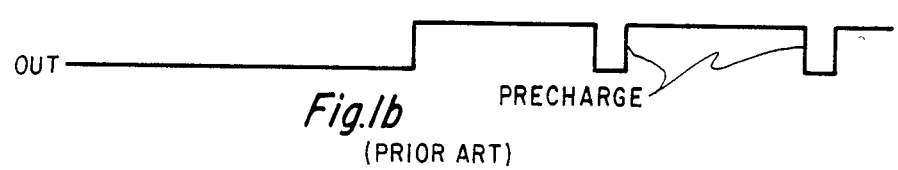
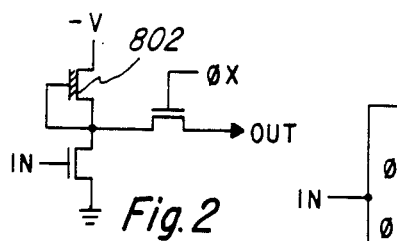
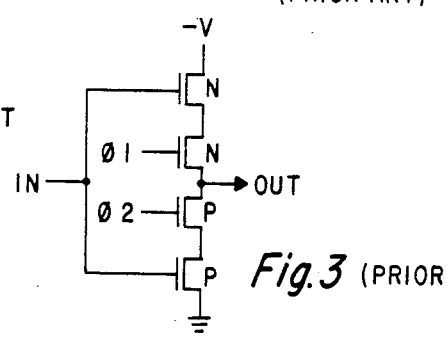
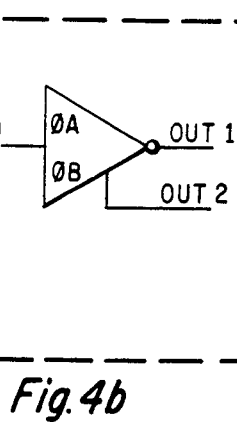
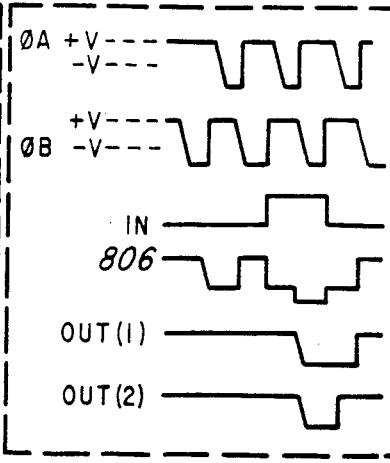
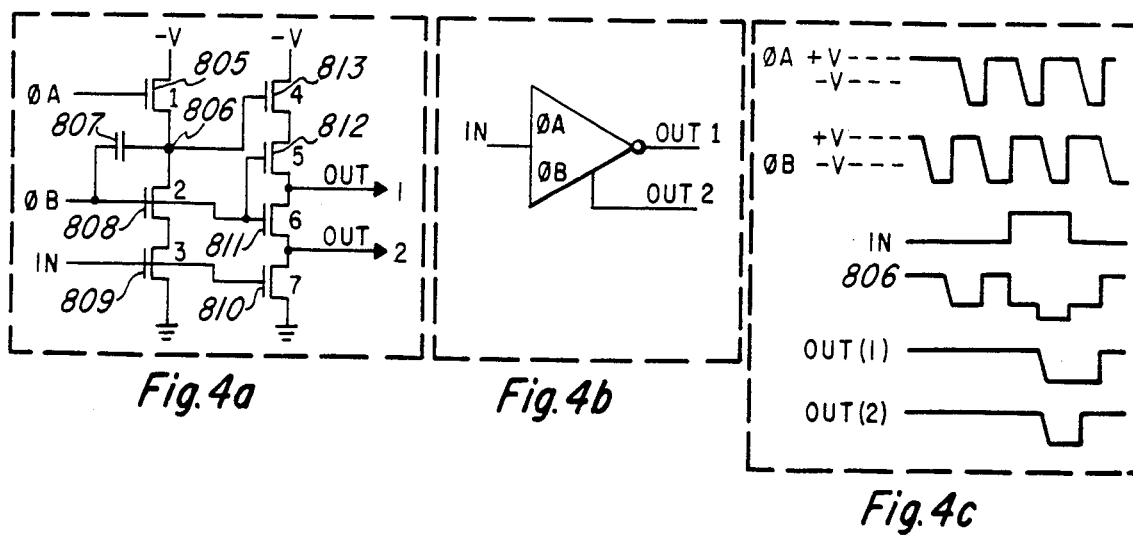

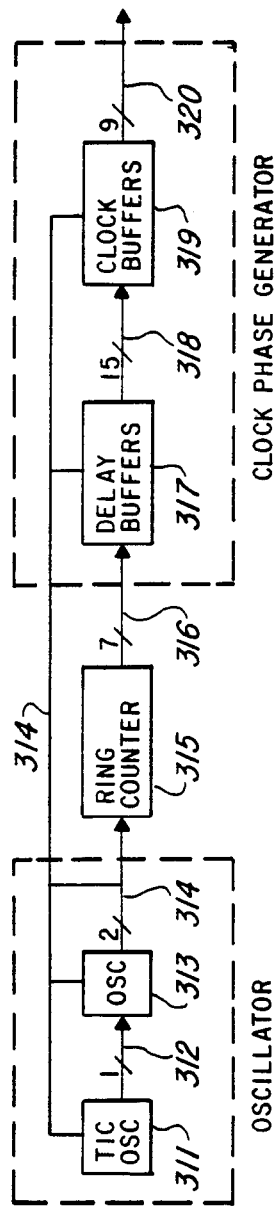
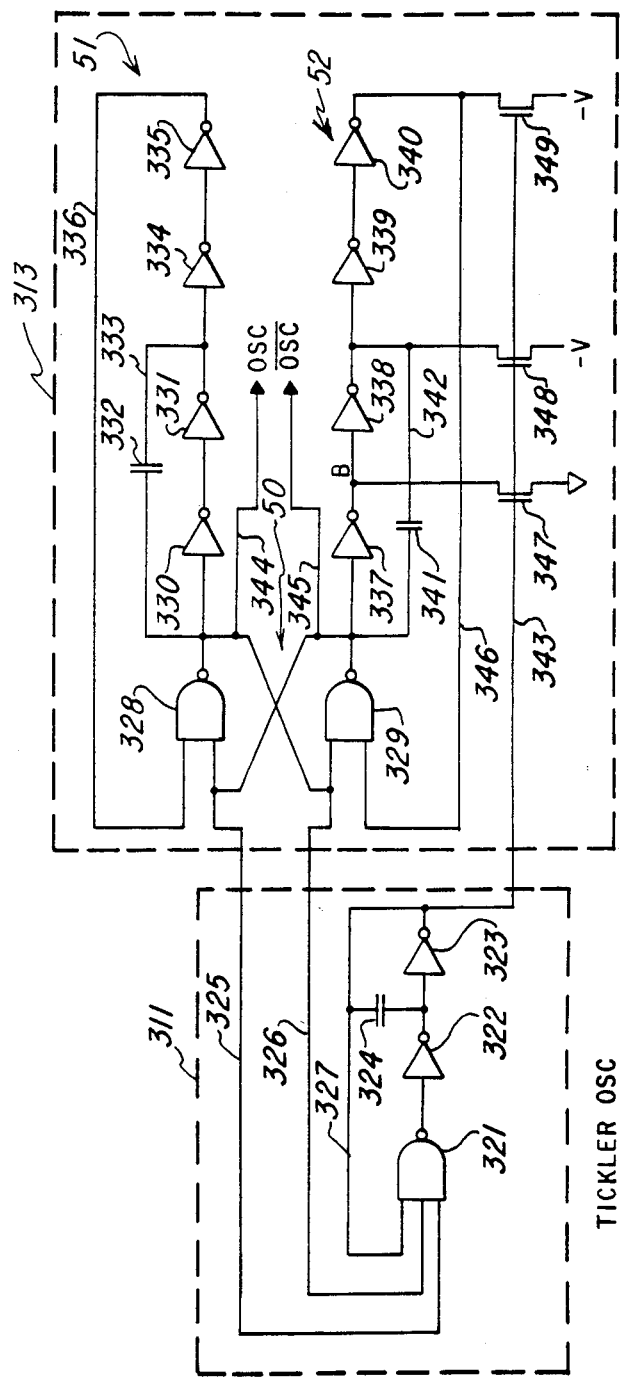
Fig.5
Fig.6

LOW POWER OSCILLATOR CIRCUIT

RELATED APPLICATIONS

U.S. patent applications that are related to the present application include U.S. Pat. Ser. No. 335,028 entitled, "Low Power Circuit For Microcomputer, U.S. patent application Ser. No. 335,029 entitled, "Low Power Display Circuit", U.S. patent application Ser. No. 335,852 entitled, "Low Voltage RAM Cell", U.S. patent application Ser. No. 334,486 entitled, "Low Power Clock Generator Circuit", and U.S. patent application Ser. No. 334,850 entitled "Integrated On/Off Switch".

BACKGROUND

1. Field of the Invention

This invention relates to digital processing circuitry and more prticularly to low power circuits for digital processing.

2. Prior Art

Electronic calculator systems of the type having all the main electronic functions within a single, large scaled integrated (LSI) semiconductor chip or small numbers of chips are described in the following prior applications or patents assigned to Texas Instruments Incorporated:

U.S. Pat. No. 3,819,921 by Kilby et al for "Miniature Electronic Calculator", based on an application originally filed Sept. 29, 1967;

U.S. Pat. No. 4,074,351 by Boone and Cochran for "Variable Function Program Calculator";

U.S. Pat. No. 3,819,957 by Bryant for "Digital Mask Logic in Electronic Calculator Chip"; and U.S. Pat. No. 3,987,416 by Vandierendonct, Fischer and Hartsell for "Electronic Calculator With Display and Keyboard Scanning".

These prior inventions made possible vast reductions in cost and size and increases in functions of electronic calculators. Many millions of such calculators have been produced. The efforts to reduce manufacturing costs and increase the functions available to the user are continuing. Particularly it is desired to provide a basic chip structure that is quite versatile and can be used for many different types of calculators and similar digital processing equipment. This permits a single manufacturing facility to produce a large quantity of the same devices, differing only in a single mask change, to produce a dozen variations while still maintaining large volume cost advantages.

The previous MOS/LSI calculator chips as referred to above were generally register organized in that a single instruction word operated on all of the digits in a given register. A more versatile approach is to make the machine digit organized, operating on one digit at a time. For example, it may be desired to test or set a particular one bit flag. In a register machine, an entire 13 digit register must be addressed and masked to implement this, whereas a digit organized machine may access only the needed digit or bit. An example of such a processing chip is disclosed in U.S. Pat. No. 3,991,305 by Caudel et al entitled, "Electronic Calculator or Digital Processor Chip with Multiple Code Combinations of Display and Keyboard Scan Outputs". This patent discloses what is commonly known in industry as the TMS 1000 architecture for a 4 bit microcomputer. Another approach using this same type of architecture is disclosed in U.S. patent application Ser. No. 216,113 entitled, "Dual Register Digital Processor System" by Koeppen, Rogers, Solimeno and Brown. The architecture disclosed herein is similar to the TMS 1000 architecture, and the architecture disclosed in the above applications is implemented with low power circuitry.

FIG. 1a illustrates a prior art attempt at low power operation using positive channel MOS (P-MOS) field effect transistor devices. This type of circuit is referred to as precharge and conditional discharge circuitry. The node 800 becomes charged during $\phi$ 3. It should be noted that since the circuitry is presented in P-MOS, the devices are active during the negative portions of the timing signals. This node remains charged until conditionally discharged by the input line during $\phi$ 1. If the input line remains high, then the node will remain charged and the output will remain at $-V$ as shown in FIG. 1b. However, if the input is low, thus activating device 801, the node 800 will be discharged during $\phi$ 1 as shown. The disadvantage to this standard percharge/discharge logic is that the precharge period can cause problems in other circuits, such as in addressing RAM cells. If percharge/discharge logic were connected directly in the addressing portion of the RAM cell, all the addresses would be ON during the precharge time. Therefore if precharge/discharge logic were to be used to address a RAM, additional circuitry would be required to buffer the precharge intervals from the addressing lines of the RAM cells.

FIG. 2 illustrates a static inverter which includes a device with the depleted region 802 to provide charge at the node connected to the output line. The static inverter removes the precharge problem; however, the static inverter also consumes a larger amount of d.c. current. The static inverter also requires that the size of the load device be much larger than any of the devices in the precharge/discharge circuitry. This is a disadvantage when fabricating the circuitry on a small silicon chip.

A third approach to the low power circuit operation is shown in FIG. 3, which is a complementary MOS (CMOS) inverter. The clocked CMOS inverter does not have precharges and does not require constant d.c. current. However, the CMOS fabrication process is more expensive and more complex than a normal PMOS or NMOS fabrication process.

The low power approach to many semiconductor display applications has included the use of CMOS, precharge/discharge and static devices. One such application is circuitry required for liquid crystal displays. Liquid crystal displays require low amounts of power and thus interface well with low power processing circuitry. A reference for liquid crystal display requirements is the *International Handbook of Liquid Crystal Displays* 1975–76, Second Edition, with 1976 Supplement by Martin Tobias, published by Ovum Ltd. 14 Pen Road, London, NC 9RD, England. Another reference is "General Information on Liquid Crystal Display", published by Epson America, Incorporated, 2990 West Lomita Boulevard, Tolerance, Calif. A third reference is an article entitled, "Liquid Crystal Displays" by L. A. Goodman, printed in the *Journal of Vacuum Science and Technology*, Vol. 10, No. 5, September/October 1973.

In the past, the LCD devices have required the use of low power circuitry such as the precharge discharge logic, or CMOS logic. This specification discloses another alternative, a low power circuit that makes possible a low power interface to LCD's without the disadvantages of the three prior art circuits.

SUMMARY OF THE INVENTION

In accordance with the present invention, an oscillator circuit is provided that includes a latch connected to two loops. Each loop is made of several dynamic inverters connected in cascade with at least one static inverter. The output of the final stage inverter of each loop is connected to the latch input. Each loop further includes a capacitor connected between the output of one of the inverters and the output of the latch. In addition, initialization circuitry is connected to at least one of the loops to start the circuit oscillating. The oscillator circuit output is characterized by having a voltage magnitude that is greater than the magnitude of the voltage provided to the oscillator circuit by the power supply.

In a preferred embodiment of this invention, an oscillator circuit is provided that includes a latch connected to two loops of cascaded inverters. Each inverter is connected to each of the two latch outputs. The output of the final stage of each loop is connected to the two separate inputs of the latch. In this embodiment, the loops contain several dynamic inverters and one static inverter. The dynamic inverters further receive timing signals from the output of the latch. In addition, each loop has a capacitor connected to the output of one inverter and the other terminal of the capacitor connected to the output of the latch. The capacitor is provided to bootstrap the voltage magnitude of the oscillator circuit output higher than that magnitude of the voltage provided by the oscillator power supply. The oscillator circuit further includes initialization circuit tied to one of the loops to initiate oscillation upon powerup.

BRIEF DESCRIPTION OF THE DRAWINGS

FIG. 1a is a schematic diagram of a prior art precharge/discharge logic.

FIG. 1b is a timing diagram for the precharge/discharge logic of FIG. 1a.

FIG. 2 is a schematic diagram of a prior art static inverter.

FIG. 3 is a schematic diagram of a prior art complementary MOS inverter.

FIG. 4a is a schematic diagram of a low power MOS inverter.

FIG. 4b is a symbolic diagram of the low power MOS circuit shown in FIG. 4a.

FIG. 4c is a timing diagram of the low power MOS circuit in FIG. 4a.

FIG. 5 is a block diagram of the oscillator and clock phase generator.

FIG. 6 is a logic diagram of the oscillator.

In the various figures of the drawing, like reference numerals are used to denote like or similar parts.

DETAILED DESCRIPTION OF THE INVENTION

Figure 7:
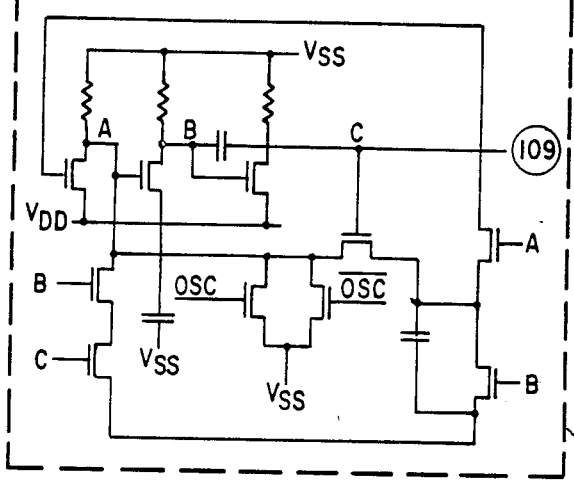
FIG. 7 is a schematic diagram of the tickler oscillator of FIG. 5.

FIG. 4a is the schematic drawing of the basic low power inverter. The symbol for this circuit in FIG. 4a is shown in FIG. 4b. Timing diagrams for this circuit are shown in FIG. 4c. Referring to FIG. 4a, the node 806 is charged during the time frame $\phi$ A by device 805. During $\phi$ B, the node 806 is discharged by the input line and device 809 if the input is low for PMOS circuitry. If, however, the input is high, then the timing signal $\phi$ B provides an additional charge through capacitor 807 to node 806. Node 806 turns on device 813 if charged and $\phi$ B likewise turns on devices 811 and 812. If the input is high, thus not turning on device 810, the lines marked "OUT 1" and "OUT 2" produce an output voltage of $-V$ as shown. It should also be noted that node 806 produces a voltage that is below $-V$ since node 806 receives charge from $-V$ or the negative rail, plus charge from the clocking phase $\phi$ B through capacitor 807. Therefore the voltage at node 806 is greater than $-V$. This type of circuitry results in a low power inverter without the use of precharge/discharge logic or static inverters. In addition, all the devices shown in FIG. 4a may be fabricated in a PMOS structure as small devices.

FIG. 5 is a block diagram of a clock generator circuit. Block 311 represents a tickler oscillator which starts the oscillator 313 via line 312. Oscillator 313 then outputs two oscillator signals to the ring counter 315 which then outputs timing signals on line 316 to the delay buffers 317. The delay buffers provide 15 signals on lines 318 to the clock buffers as shown. Nine clock signals are output on lines 320. The logic diagram of the oscillator circuit and tickler circuit is shown in FIG. 6. Block 311 contains logic for the tickler oscillator which includes a static NAND gate 321 connected to two static inverters 322 and 323. Note that capacitor 324 is connected from the output of the inverter 322 to an input of the static NAND gate 321. This capacitor adds charge to the output of devices 323 to drive devices 347, 348 and 349 in the main oscillator. This technique is called "bootstrapping" or driving the value to a voltage that is greater than the negative power supply. The purpose of the tickler oscillator is to start the oscillator 313 upon power up. Oscillator 313 is illustrated as two loops of inverters connected with NAND gates that are cross coupled. Note that capacitors 332 and 341 are provided in these inverter loops to provide extra charge for the oscillator outputs at 344 and 345. Inverters 330, 334, and 338 are gated by $\overline{OSC}$. Inverters 331, 337 and 339 are gated by OSC. Inverters 335 and 340 are similar to the static inverters as illustrated in FIG. 2. NAND gates 328 and 329 are gated by Signal A and Signal B, respectively.

The static inverters 335 and 340 can be fabricated in the manner described above with reference to the prior art static inverters shown in FIG. 2 above, and the low power inverters 330, 331, 334, 337, 338, and 339 can be fabricated in accordance with the invention as exemplified by the inverter circuit described with reference to FIG. 4a.

Figure 8:
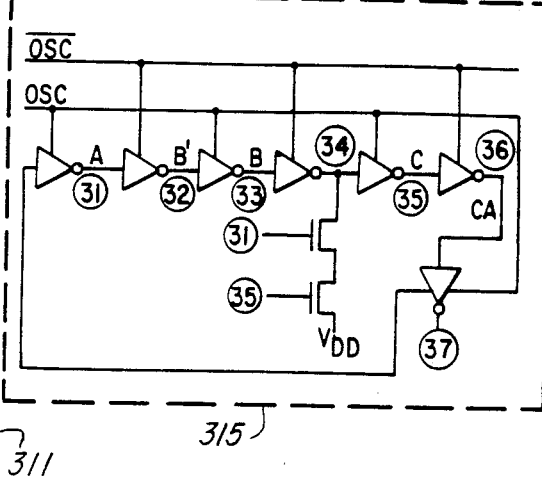
FIG. 8 is a schematic diagram of the ring counter of FIG. 5.
Figure 9:
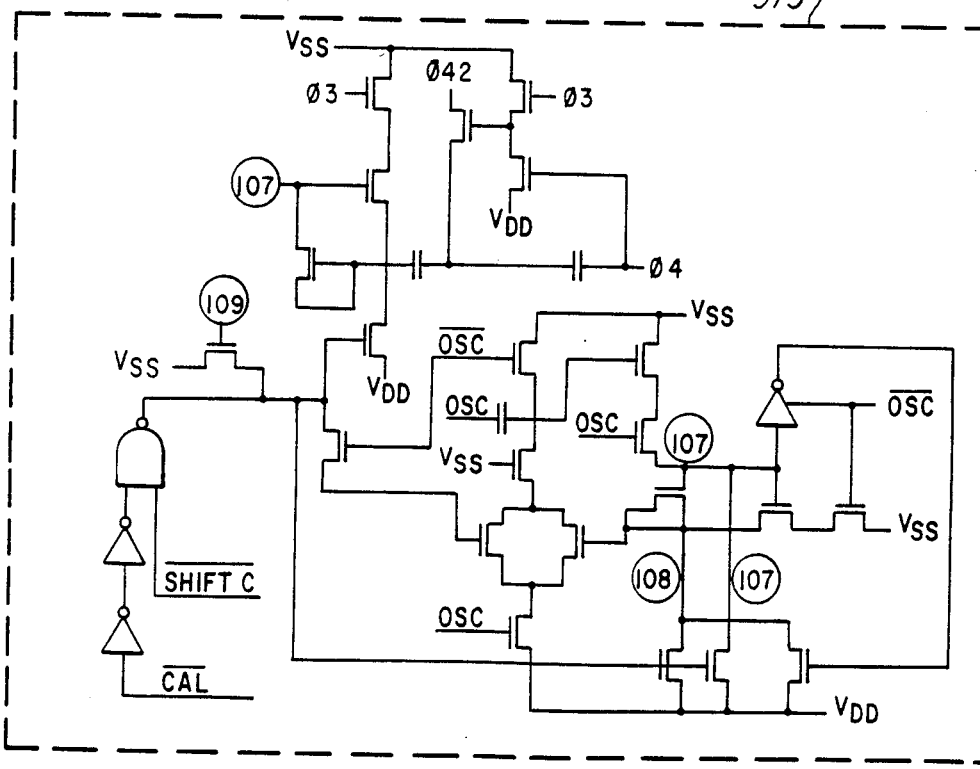
FIG. 9 is a schematic diagram of a bootstrap circuit for use in the oscillator of FIG. 5.
Figure 10A:
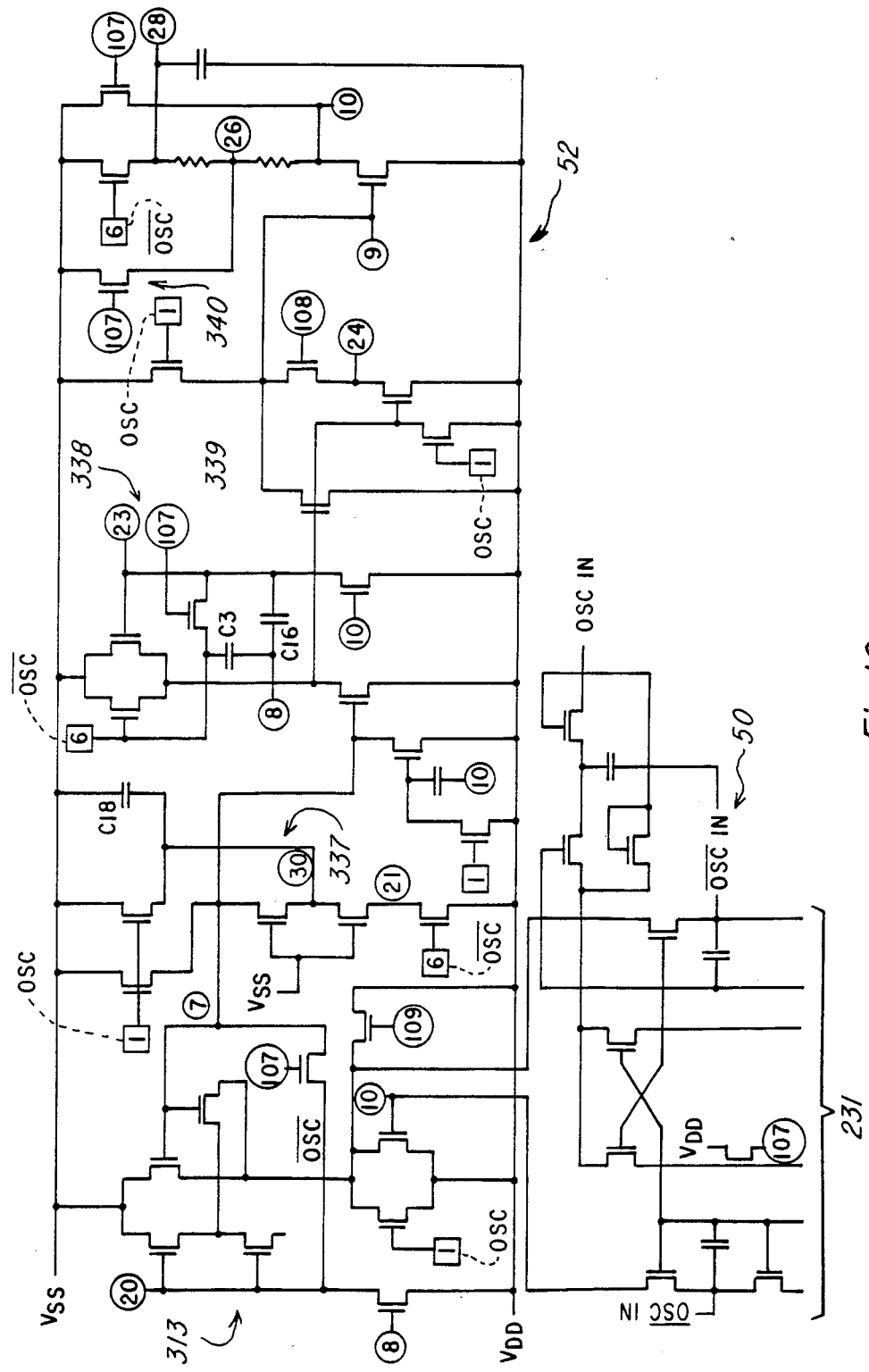
FIG. 10 is a schematic diagram of the oscillator circuit of FIG. 5.
Figure 10B:
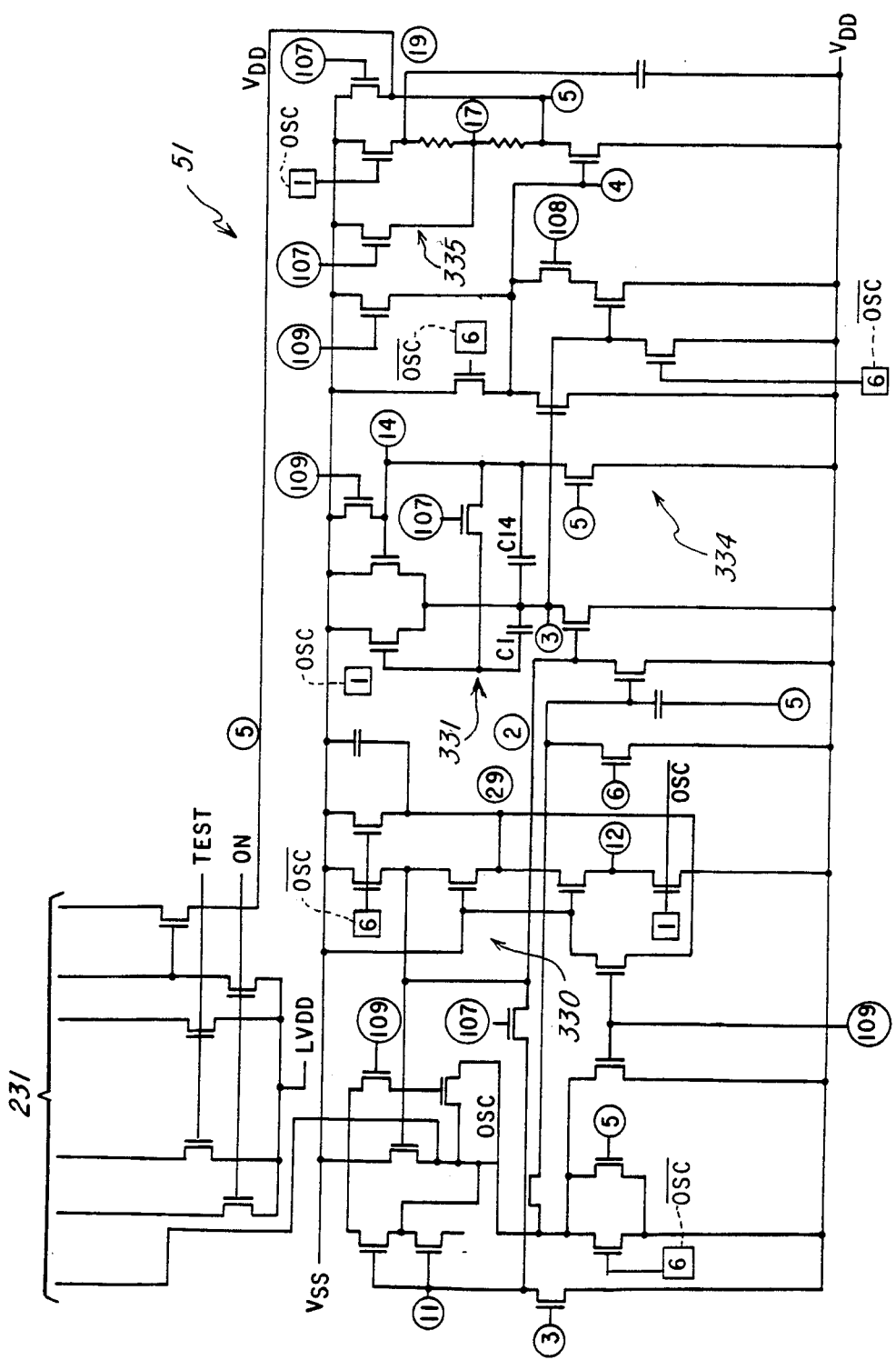

The block diagrams of FIGS. 5 and 6 can be accomplished with a circuit fabricated in accordance with the schematic diagrams shown in FIGS. 7, 8, 9 and 10. FIG. 7 is a schematic diagram of the tickler circuit 311; FIG. 8 is a schematic diagram of the ring counter 315 (see FIG. 5); FIG. 9 is a schematic diagram of the bootstrapping circuit 975 which may be used in the oscillators of FIG. 6. FIG. 10 is a schematic diagram of one way of accomplishing the main oscillator circuit 313 of FIG. 6, using precharge and discharge circuits similar to that described above with reference to FIG. 4a above. In FIG. 10, the NAND gate multivibrator 50 is located between the digital oscillator channels 51 and 52 (the upper and lower channels in FIG. 10 correspond respectively to the lower and upper channels of FIG. 6). The various inverters and capacitors of FIG. 6 are also shown generally in FIG. 10.

What is claimed is:

1. A digital oscillator, comprising:

first and second oscillator loops, each including a logical combination gate within the loop, a plurality of low power inverters connected in cascade from a first low power inverter to a last low power inverter, and a feedback capacitor connected from an output of a second inverter of said plurality of the low power inverter inverters to an input of the first low power inverter the output of a last member of said plurality of low power inverters being connected to a first input of said logical combination gate;

first and second connection means where the first connection means being for connecting the output of the logical combination gate of the first oscillator loop to the input of the first low power inverter means of the first oscillator loop and to a second input of the logical combination gate of the second oscillator loop and wherein the second connection means being for connecting the output of the logical combination gate of the second oscillator loop to the input of the first low power inverter means of the second oscillator loop and to a second input of the logical combination gate of the first oscillator loop such that the logical combination gates of said first and second oscillator loops being connected together to form a bistable multivibrator to produce alternate pulses of oscillator output signals at respective outputs of said logical combination gates;

at least one of said inverters in each of said oscillator loops including;

a precharge/discharge node;

means for selectively preventing current flow through said precharge/discharge node;

means for establishing a precharge voltage on said precharge/discharge node during a time when said precharge/discharge node has no current flow, and means for selectively allowing the current flow through said precharge/discharge node for discharging said precharge voltage to produce an inverter output; and each of said low power inverters comprises:

a first, second and third MOSFET device connected in series from the first to third MOSFET devices in a first circuit, the control elements of a first and second of said MOSFET devices being connected to receive respective first and second out of phase clock pulses;

a capacitor connected between the control element of the second MOSFET device and a node at an interconnection between said first and second MOSFET devices said node being said precharge/discharge node;

said third MOSFET device having its control element connected to receive an input signal;

at least three MOSFET devices connected in series in a second circuit;

the control element of an outside one of said at least three MOSFET devices being connected to said precharge/discharge node;

the control element of the other outside one of said at least three MOSFET devices being connected to receive the input signal;

the control element of at least one central MOSFET device of said at least three MOSFET devices being connected to receive the clock signal connected to said control element of said MOSFET in said first series circuit to which said capacitor is connected, an inverter output being developed at an interconnection between said at least one central MOSFET device and the other outside one of said at least three MOSFET devices.

2. The oscillator circuit of claim 1 further comprising:

timing signal means connected to the outputs of the logical combination gates of the first and second oscillator loops for generating timing signals.

* * * * *